United States Patent
Kelly et al.

(10) Patent No.: US 7,359,198 B2
(45) Date of Patent: Apr. 15, 2008

(54) SYSTEM AND METHOD FOR INDUCING TURBULENCE IN FLUID FOR DISSIPATING THERMAL ENERGY OF ELECTRONIC CIRCUITRY

(75) Inventors: Michael G. Kelly, Corvallis, OR (US); Mark D. Johnson, Corvallis, OR (US); William H. Sisson, Corvallis, OR (US); Jeffrey P. Tobin, Corvallis, OR (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 218 days.

(21) Appl. No.: 11/238,418

(22) Filed: Sep. 29, 2005

(65) Prior Publication Data

US 2007/0242434 A1    Oct. 18, 2007

(51) Int. Cl.
H05K 7/20 (2006.01)
F28F 7/00 (2006.01)
H01L 23/34 (2006.01)

(52) U.S. Cl. .................. 361/699; 165/80.4; 257/714; 361/698

(58) Field of Classification Search ................ 257/714; 165/80.4; 361/699
See application file for complete search history.

(56) References Cited

U.S. PATENT DOCUMENTS

| | | | | |
|---|---|---|---|---|
| 5,406,807 A | * | 4/1995 | Ashiwake et al. | ............. 62/376 |
| 6,529,377 B1 | * | 3/2003 | Nelson et al. | ............. 361/699 |
| 6,665,180 B2 | * | 12/2003 | Lehman et al. | ............. 361/687 |
| 7,055,581 B1 | * | 6/2006 | Roy | ............. 165/104.33 |
| 7,134,484 B2 | * | 11/2006 | Mok et al. | ............. 165/80.4 |
| 2002/0186538 A1 | | 12/2002 | Kase et al. | |
| 2003/0189813 A1 | | 10/2003 | Lee | |
| 2004/0261975 A1 | | 12/2004 | Kozyra et al. | |
| 2005/0092475 A1 | | 5/2005 | Ambros et al. | |
| 2005/0095701 A1 | | 5/2005 | Sah et al. | |

OTHER PUBLICATIONS

Fan, L., "Design and Fabrication of Microactuators for High Density Data Storage", IEEE Transactions on Magnetics, vol. 32, No. 3, May 1996, pp. 1855-1862.

Simons, R. et al., "Reconfigurable Array Antenna Using Microelectromechanical Systems (MEMS) Actuators", 2001 IEEE, pp. 674-677.

Sanders, R., "Physicists build world's smallest motor using nanotubes and etched silicon", [Online] Retrieved Aug. 29, 2005, http://www.berkeley.edu/news/media/releases/2003/07/23_motor.shtml 5 pages.

* cited by examiner

*Primary Examiner*—Gregory D Thompson

(57) ABSTRACT

A method for cooling a circuit comprises generating movement of fluid along a path through a closed-loop system. The method further comprises inducing turbulence in the fluid by movement of at least a portion of a turbulence-inducing device arranged in the path, and dissipating thermal energy from the circuit by the fluid. A system comprises a circuit, and a closed-loop cooling system comprising fluid for cooling the circuit and at least one active turbulence-inducing device. In one embodiment, the turbulence-inducing device is a microelectromechanical system (MEMS) device. In one embodiment, the MEMS device is solely responsible for bulk fluid movement through the closed-loop cooling system.

29 Claims, 2 Drawing Sheets

SYSTEM AND METHOD FOR INDUCING TURBULENCE IN FLUID FOR DISSIPATING THERMAL ENERGY OF ELECTRONIC CIRCUITRY

FIELD OF THE INVENTION

The following description relates in general to thermal management systems for electronic circuitry, and more particularly to systems and methods for inducing turbulence in a fluid for dissipating thermal energy of electronic circuitry.

DESCRIPTION OF RELATED ART

It is often desirable to dissipate heat produced by electronic circuits. For example, it is generally desirable to operate complementary metal-oxide semiconductor (CMOS) devices at no more than about 110° C. Thus, thermal management often becomes an important consideration for electronic circuits. It is important to provide heat dissipation for electronic circuits to allow for a lower operating temperature, higher operating speeds and greater computing power. If the heat generated by the circuitry is not adequately removed/reduced, the increased temperatures generated by the circuitry can damage such circuitry. Accordingly, it is advantageous to dissipate the generated heat to allow for a lower operating temperature not only to enable better performance of the electronic circuits but also to provide higher reliability and availability of such circuits.

Various thermal management schemes have been developed for maintaining electronic circuits sufficiently cool. In integrated circuits (ICs), for example, the IC is typically encapsulated in some kind of package. The package generally protects the IC, provides an electrical interconnect from the IC to a circuit board, and aids in dissipating the thermal energy that is created by the operation of the IC. Many thermal management schemes employ active cooling of the circuitry. For example, heat sinks are often attached to the top of an IC package, and a fan may be employed to force air across the fins of the heat sink to assist in removing thermal energy from the IC.

Various thermal management schemes utilize moving fluid for removing thermal energy from the circuitry. The moving fluid may be in any suitable form, including liquid (e.g., water, Freon, etc.) and gas. Typically, a closed-loop system is employed, wherein a pumping source re-circulates the fluid along one or more paths adjacent to the circuitry (e.g., within the package of an IC) for removing thermal energy from the circuitry. In certain systems, an electrically inert fluid is circulated directly over the circuitry for removing the circuitry's thermal energy.

Various thermal management schemes are known which employ moving fluid for removing thermal energy generated by electronic circuitry. To improve the efficiency of the moving fluid (with regard to its ability to remove thermal energy from the circuitry), it is desirable to create a turbulent flow in the boundary layer. As is known in the art, the "boundary layer" refers to the thin layer of fluid immediately adjacent to a mechanical surface that the fluid is passing over. This boundary layer is a transition layer whereby the fluid transitions from the bulk velocity to a zero velocity precisely at the mechanical surface. Traditional thermal management schemes attempt to increase the velocity of the circulating fluid in order to produce turbulence. If the fluid is not circulated fast enough, it remains non-turbulent and the amount of heat transfer into that fluid is thereby limited. By achieving turbulence in the fluid, the rate of which heat is transferred is generally accelerated by 300-500 percent.

However, generating sufficient velocity for producing turbulence in the fluid also requires energy. That is, energy must be expended (e.g., by a motor-driven pump) for generating the desired velocity that produces turbulence. Further, a high velocity may damage the electronic component. For instance, in a wire bond package interconnect, wires for making electrical contact extend from the IC through the package, and if the velocity of the fluid moving through the package is too great, it may result in "wire sweep" in which the wires are physically dislocated or stretched by the fluid, which may result in the wires contacting each other or breaking.

BRIEF SUMMARY OF THE INVENTION

Embodiments of the present invention provide turbulence-inducing devices that are arranged in the path of thermal management fluid in order to induce turbulence in such fluid, thereby enhancing the efficiency of the fluid's ability to remove thermal energy from electronic circuitry. Because such turbulence-inducing devices are included, the velocity of the fluid need not be relied upon (at least not solely relied upon) for inducing the desired turbulence in the fluid. Thus, in certain embodiments, the turbulence-inducing devices enable turbulence to be achieved in the fluid at lower velocity than would be otherwise required if such turbulence-inducing devices were not present.

In certain embodiments, the turbulence-inducing devices are passive devices that are arranged in the path of the thermal management fluid in order to induce turbulence. In other embodiments, the turbulence-inducing devices are active devices, such as microelectromechanical system (MEMS) devices, that are utilized to induce turbulence in the fluid. For instance, in certain embodiments, the turbulence-inducing devices comprise actuators that may be powered to locally accelerate the fluid and thereby induce turbulence in the fluid. Further, in certain embodiments, the active turbulence-inducing devices are actually responsible for generating the bulk movement of the fluid. For instance, in certain embodiments, the active turbulence-inducing devices comprise a motor and fluid moving component (e.g., impellers) that are operable to circulate the fluid through a closed-loop system. Thus, the active turbulence-inducing devices may act not only to induce turbulence, but may also be responsible for circulating the fluid, thus alleviating a separate pump for circulating the fluid. As used herein, active devices refer to devices that are electrically powered (e.g., to generate movement of the devices for inducing turbulence in the fluid), while passive devices refer to devices that are not electrically powered. According to certain embodiments of the present invention, an active or passive turbulence-inducing device may comprise at least a portion of such device that moves in some way to induce turbulence in fluid. For instance, a passive device may comprise a portion thereof that moves responsive to the fluid applying force thereto, such as with a windmill moving responsive to force applied thereto by wind, and such movement in the passive device induces turbulence in the fluid.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
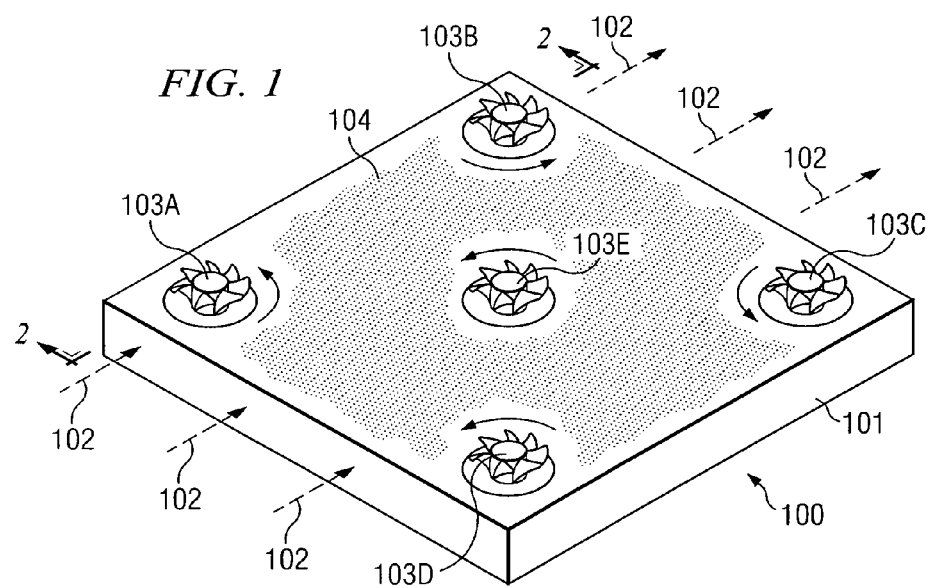
FIG. 1 shows one embodiment of the present invention.

FIG. 1 shows one embodiment of the present invention. In FIG. 1, system 100 includes circuitry (e.g., IC) 101, which generates thermal energy during its operation. System 100 also includes a thermal management system for removing thermal energy from circuitry 101. In this example, such thermal management system includes moving fluid 102, which may be a liquid or gas as examples. Such fluid 102 may be employed in a closed-loop system, wherein it is re-circulated along one or more paths for removing thermal energy from the underlying circuitry 101. In this embodiment, the thermal management system further includes turbulence-inducing devices 103A-103E (referred to collectively as turbulence-inducing devices 103) arranged in the path of the fluid 102, thereby inducing turbulence 104 in the fluid. Such turbulence-inducing devices may be any suitable device for inducing turbulence 104 in fluid 102. In the exemplary implementation shown in FIG. 1, the turbulence-inducing devices 103 include impellers that rotate to induce turbulence 104. Of course, in other implementations, other types of turbulence-inducing devices (which may rotate and/or move in some other fashion, or which may be stationary may be arranged in the path of the moving fluid 102 for inducing turbulence 104.

In certain embodiments, the turbulence-inducing devices 103 are passive. For instance, the impellers shown in the exemplary implementation of FIG. 1 may rotate responsive to force applied thereto by the moving fluid 102, rather than being actively powered to generate such rotation.

In other embodiments, the turbulence-inducing devices 103 are active devices that can be powered to impart movement (e.g., rotation or other actuation) in the device. For example, in certain embodiments, the turbulence-inducing devices 103 are MEMS devices that are powered to actuate in some manner for inducing turbulence 104 in fluid 102. Various types of MEMS devices that are operable to achieve actuation (e.g., lateral and/or rotational actuation) are known, including as examples electrothermal microactuators, and any MEMS device now known or later developed that is operable for generating some movement for inducing turbulence in the fluid 102 may be utilized in accordance with embodiments of the present invention. Exemplary MEMS devices that may be utilized include those described in the following: 1) Tuantranont, et al., "Smart Phase-Only Micromirror Array Fabricated By Standard CMOS Process," IEEE 0-7803-5273-4/00 (2000) pp. 455-460 (describing a piston micro-mirror incorporating four bimorphs in a standard CMOS foundry process providing a metalization layer, which is usually used only to conduct signals, on top of an oxide layer or a polysilicon layer involved in the process. Generally, bimorph configurations include a beam which has two different material layers, and resistive joule heating is used to actuate the device, i.e. when current passes through it, it heats and deflects slightly); 2) Hornbeck, et al., "Digital Micromirror Device™—Commercialization of a Massively Parallel MEMS Technology," American Society of Mechanical Engineers, (DSC-Vol. 62, 1997), pp. 3-8 (describing a tilting mirror supported and actuated by an electrostatically-driven torsion bar); 3) Toshiyoshi, et al., "Electrostatic Micro Torsion Mirrors for an Optical Switch Matrix," IEEE J. Microelectromechanical Systems, Vol. 5, No. 4 (December 1996), pp. 231-237; 4) Motamedi, et al., "Micro-optomechanical Devices and On Chip Optical Processing," Opt. Eng. Vol. 38, No. 5 (May 1997), pp. 1282-1297 (describing a micro optical bench on which mirrors on a micron scale are hinged to a substrate and rotated up to 90 degrees, i.e. perpendicular to the substrate, using bent beam or scratch drive actuators); 5) Judy, et al., "Magnetically Actuated, Addressable Microstructures," IEEE J. Microelectromechanical Systems, Vol. 6, No. 3 (September 1997), pp. 249-256 (describing using a large magnetic field on the outside to activate micro devices made, for instance, of permalloy material. When the external magnetic field is applied, the magnetic material aligns itself in a new orientation, which is dependent on the field geometry); and 6) Que, et al., "Bent-Beam Electrothermal Actuators—Part I: Single Beam and Cascaded Devices," IEEE J. Microelectromechanical Systems, Vol. 10, No. 2, (June 2001), pp. 247-254 (describing cascading of bent beams by aligning two bent beam actuators at a selected angle relative to a third bent beam actuator).

In certain embodiments, the turbulence-inducing devices 103 (e.g., MEMS devices) are powered by the circuit 101 and/or by the circuit's power supply. Thus, in certain embodiments, the turbulence-inducing devices 103 operate when the circuit 101 is powered. In other embodiments, the turbulence-inducing devices 103 may selectively operate when the circuit 101 is powered. For instance, in certain embodiments a temperature sensor may be included in the thermal management system, and the turbulence-inducing devices 103 may operate only when the temperature sensed for the circuitry 101 exceeds a predefined threshold.

Figure 2:
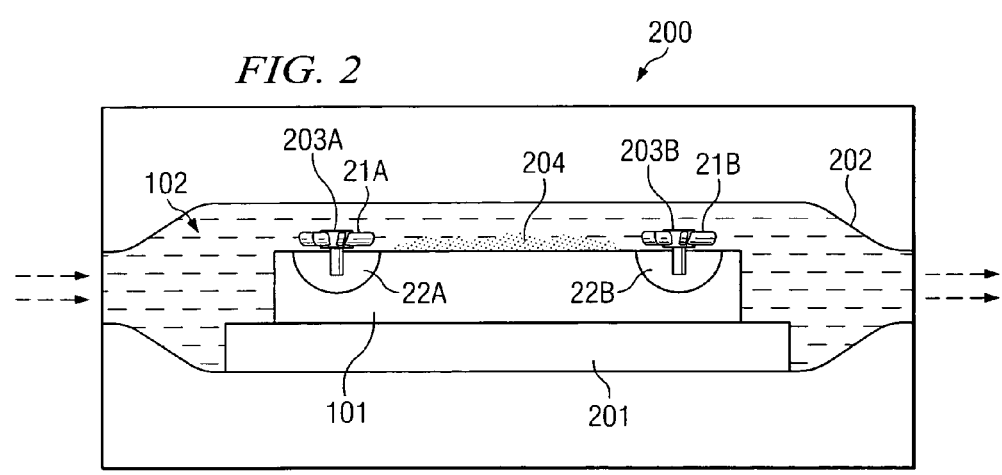
FIG. 2 shows a cross-sectional view of another embodiment of the present invention.

Turning now to FIG. 2, a cross-section 200 of one embodiment (taken as indicated in FIG. 1) is shown. This exemplary embodiment again includes circuitry (e.g., IC) 101, which generates thermal energy during its operation. In this example, circuitry 101 is coupled to substrate (e.g., circuit board) 201. Further, a thermal management system for removing thermal energy from circuitry 101 is again included. In this example, such thermal management system includes moving fluid 102, which may be a liquid or gas as examples. Such fluid 102 may be employed in a closed-loop system, wherein it is re-circulated along one or more paths, such as path 202, for removing thermal energy from the underlying circuitry 101. In this embodiment, the thermal management system further includes turbulence-inducing devices 203A-203B (referred to collectively as turbulence-inducing devices 203) arranged in the path 202 of the fluid 102, thereby inducing turbulence in the fluid. In this particular example, turbulence-inducing devices 203 include impellers and a motor for driving such impellers. For instance, turbulence-inducing device 203A is a MEMS device that includes a motor 22A for driving impeller 21A; and turbulence-inducing device 203B is likewise a MEMS device that includes a motor 22B for driving impeller 21B. Exemplary MEMS devices may be implemented, for instance, having a motor such as the nanometer-scale motor built by the Zettl research group at the University of California Berkeley and Lawrence Berkeley National Laboratory in which a gold rotor turns on a carbon carbon nanotube shaft powered by two charged stators patterned on a silicon surface. Of course, any micrometer- or nanometer-scaled motor now known or later developed may be utilized in accordance with embodiments of the present invention.

In this exemplary embodiment, turbulence-inducing devices 203 may not only induce turbulence in fluid 102 by disrupting the flow locally, thereby making boundary layer 204 thinner but also acts as the pumping source for driving circulation of fluid 102 through the thermal management system. An advantage of using the turbulence-inducing devices as the pumping source is that very small quantities of a fluid could be used in a system with limited space, and where larger volumes of cooling fluid are not needed to attain the proper amount of cooling. Additionally, while the MEMS devices consume power in this configuration, a separate pumping source is not needed, which may result in a net power savings (if the MEMS devices consume less power than a separate pump would). And, because the separate pump is not needed, the overall size (footprint) of the thermal management system may be reduced.

Figure 3:
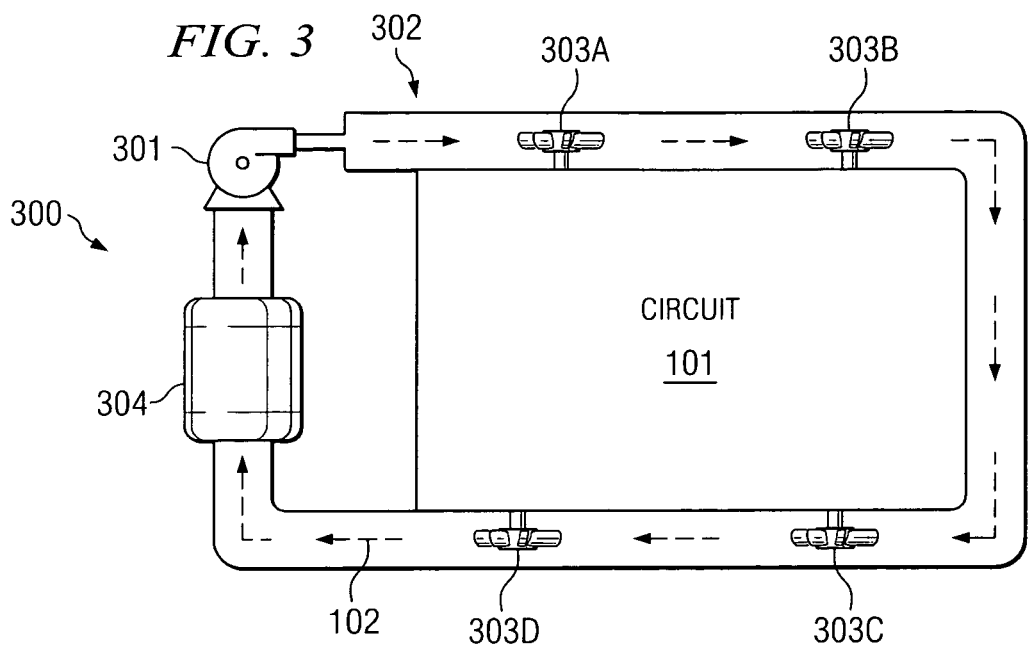
FIG. 3 shows still another embodiment of the present invention.

FIG. 3 shows an exemplary system 300 according to one embodiment of the present invention. In this embodiment, circuitry 101 is again included, which generates thermal energy during its operation. Further, a thermal management system for removing thermal energy from circuitry 101 is again included. In this example, such thermal management system includes a closed-loop system 302 through which fluid 102 is re-circulated by pump 301. Excess fluid may be stored in reservoir 304, which may also cool the fluid. In this embodiment, the thermal management system further includes turbulence-inducing devices 303A-303D (referred to collectively as turbulence-inducing devices 303) arranged in the path of the fluid 102, thereby inducing turbulence in the fluid. Such turbulence-inducing devices 303 may be any suitable type of devices (e.g., MEMS devices) that are capable of actuation for inducing turbulence in fluid 102. In this particular example, the turbulence-inducing devices 303 are not responsible for driving fluid 102 through the closed-loop system 302, but instead pump 301 drives the fluid and turbulence-inducing devices 303 induce turbulence therein to improve the efficiency of the fluid's ability to remove the thermal energy from circuitry 101. Thus, in this example, the turbulence-inducing devices 303 may not consume as much power as the devices 203 in the above-exemplary system of FIG. 2 in which the devices also drive the circulation of the fluid. However, a separate pump 301 is included in this embodiment. That is, when pumping the bulk fluid, the power required is greater than when simply agitating the fluid for the purpose of inducing turbulence in the flow.

Figure 4:
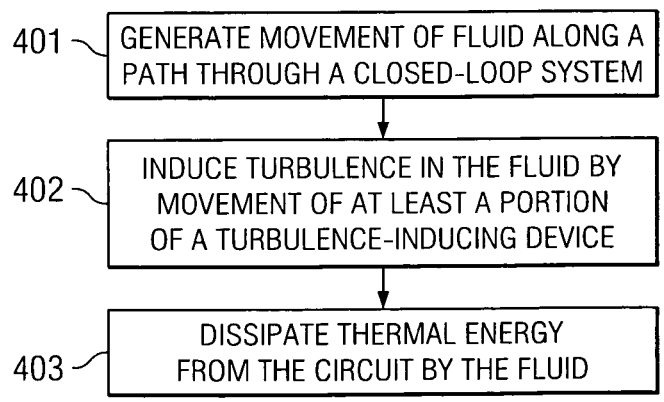
FIG. 4 shows an operational flow diagram of one embodiment of the present invention.

FIG. 4 shows an operational flow diagram for cooling a circuit according to one embodiment of the present invention. In operational block 401, movement of fluid is generated along a path through a closed-loop thermal management system. That is, fluid is circulated through a path of a closed-loop thermal management system. In operational block 402, movement of at least a portion of a turbulence-inducing device is used to induce turbulence in the fluid. For instance, in certain embodiments, MEMS device(s) is/are activated to generate actuation of such devices for inducing turbulence in the fluid. In certain embodiments, the turbulence-inducing devices are activated not only to induce turbulence in the fluid, but also to generate the movement of the fluid in block 401. In operational block 403, the fluid dissipates the thermal energy from the circuit. As described above, the turbulence induced by the turbulence-inducing devices enhances the efficiency of the fluid with regard to its ability to dissipate the thermal energy of the circuitry.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A system comprising:
an integrated circuit; and
a closed-loop cooling system comprising fluid for cooling said integrated circuit and at least one turbulence-inducing device adjacent to the integrated circuit and arranged in a path of movement of said fluid through said closed-loop system, wherein the path of movement of said fluid is such that the fluid traverses a leading edge and a following edge of the integrated circuit in a direction of flow.

2. The system of claim 1 wherein said turbulence-inducing device is a passive device.

3. The system of claim 1 wherein said turbulence-inducing device is an active device.

4. The system of claim 3 wherein said turbulence-inducing device is a microelectromechanical system (MEMS) device.

5. The system of claim 4 wherein said MEMS device comprises at least one selected from the group consisting of:
micro-actuator, micro-impeller, and micro-rotor.

6. The system of claim 3 wherein said turbulence-inducing device is a device that generates movement of said fluid through said closed-loop cooling system.

7. The system of claim 3 wherein said turbulence-inducing device is solely responsible for bulk fluid movement through said closed-loop cooling system.

8. The system of claim 1 wherein at least a portion of said turbulence-inducing device moves, thereby inducing turbulence in said fluid.

9. The system of claim 1 further comprising a pump for bulk fluid movement through said closed-loop cooling system.

10. The system of claim 1 wherein said at least one turbulence-inducing device arranged in a path of movement of said fluid is solely responsible for bulk fluid movement through said closed-loop cooling system.

11. The system of claim 1 wherein said fluid comprises one selected from the group consisting of:
liquid and gas.

12. A system comprising:
a circuit; and
a closed-loop cooling system comprising fluid for cooling said circuit and at least one active turbulence-inducing device adjacent to the circuit, a path of movement of said fluid through said closed-loop system traversing a leading edge and a following edge of the circuit in a direction of flow.

13. The system of claim 12 wherein said turbulence-inducing device is a microelectromechanical system (MEMS) device.

14. The system of claim 13 wherein said MEMS device comprises at least one selected from the group consisting of:
micro-actuator, micro-impeller, and micro-rotor.

15. The system of claim 13 wherein said MEMS device is solely responsible for bulk fluid movement through said closed-loop cooling system.

16. The system of claim 12 wherein said turbulence-inducing device comprises a nanometer-scaled motor.

17. The system of claim 12 wherein said turbulence-inducing device is a device that generates movement of said fluid through said closed-loop cooling system.

18. The system of claim 12 wherein said turbulence-inducing device is solely responsible for bulk fluid movement through said closed-loop cooling system.

19. The system of claim 12 further comprising a pump for bulk fluid movement through said closed-loop cooling system.

20. The system of claim 12 wherein at least a portion of said active turbulence-inducing device moves, thereby inducing turbulence in said fluid.

21. The system of claim 12 wherein said circuit is an integrated circuit.

22. The system of claim 12 wherein said fluid comprises one selected from the group consisting of:
liquid and gas.

23. A method for cooling a circuit comprising:
generating movement of fluid along a path through a closed-loop system;
inducing turbulence in said fluid by movement of at least a portion of a turbulence-inducing device arranged adjacent to said circuit in said path, the path through said closed-loop system traversing a leading edge and a following edge of said circuit in a direction of flow; and
dissipating thermal energy from said circuit by said fluid.

24. The method of claim 23 wherein said inducing turbulence comprises:
inducing said turbulence by an active turbulence-inducing device.

25. The method of claim 24 wherein said inducing turbulence comprises:
inducing turbulence by a microelectromechanical system (MEMS) device.

26. The method of claim 23 wherein said inducing turbulence comprises:
inducing turbulence by a passive turbulence-inducing device, wherein said movement of said at least a portion of said turbulence-inducing device occurs responsive to force applied thereto by said fluid.

27. The method of claim 23 wherein said inducing turbulence comprises:
inducing turbulence by a microelectromechanical system (MEMS) device that is also solely responsible for bulk fluid movement through said closed-loop system.

28. The method of claim 23 wherein said circuit is an integrated circuit.

29. The method of claim 23 wherein said fluid comprises one selected from the group consisting of:
liquid and gas.

* * * * *